US011313222B2

(12) United States Patent
Stark et al.

(10) Patent No.: US 11,313,222 B2
(45) Date of Patent: *Apr. 26, 2022

(54) COOLED SINGLE-PHOTON DETECTOR APPARATUS AND METHODS

(71) Applicant: Halliburton Energy Services, Inc., Houston, TX (US)

(72) Inventors: Daniel Joshua Stark, Houston, TX (US); John L. Maida, Houston, TX (US); Satyan Gopal Bhongale, Cypress, TX (US); David Andrew Barfoot, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 635 days.

This patent is subject to a terminal disclaimer.

(21) Appl. No.: 16/305,548

(22) PCT Filed: Aug. 26, 2016

(86) PCT No.: PCT/US2016/048930
§ 371 (c)(1),
(2) Date: Nov. 29, 2018

(87) PCT Pub. No.: WO2018/038735
PCT Pub. Date: Mar. 1, 2018

(65) Prior Publication Data
US 2021/0222549 A1    Jul. 22, 2021

(51) Int. Cl.
*E21B 47/135* (2012.01)
*G01H 9/00* (2006.01)
(Continued)

(52) U.S. Cl.
CPC .......... *E21B 47/135* (2020.05); *G01H 9/004* (2013.01); *G01J 1/0252* (2013.01); *G01J 1/42* (2013.01);
(Continued)

(58) Field of Classification Search
CPC ...... E21B 47/135; G01H 9/004; G01J 1/0252; G01J 1/42; G01J 2001/442; H01L 39/10; G01V 2210/1429; G01V 8/02; G02B 6/00
See application file for complete search history.

(56) References Cited

U.S. PATENT DOCUMENTS 6,522,797 B1    2/2003 Siems et al.
6,812,467 B2    11/2004 Nakamura et al.
(Continued)

FOREIGN PATENT DOCUMENTS

CN    103575504 A    2/2014

OTHER PUBLICATIONS

Anant et al. "Optical Properties of Superconducting Nanowire Single-Photon Detectors." *Optics Express*. vol. 16, Issue 14, p. 10750-10761. Jul. 2008.
(Continued)

*Primary Examiner* — Marcus H Taningco
(74) *Attorney, Agent, or Firm* — Haynes and Boone, LLP

(57) ABSTRACT

In some embodiments, a method and apparatus, as well as an article, may operate to determine downhole properties based on detected optical signals. An optical detection apparatus can include an optical detector including a superconducting nanowire single photon detector (SNSPD) for detecting light received at an input section of fiber optic cable. The optical detection apparatus can further include a cryogenic cooler configured to maintain the temperature of a light-sensitive region of the SNSPD within a superconducting temperature range of the SNSPD. Downhole properties are measured based on detected optical signals received at the optical detection apparatus. Additional apparatus, systems, and methods are disclosed.

20 Claims, 11 Drawing Sheets

(51) Int. Cl.
G01J 1/02 (2006.01)
G01J 1/42 (2006.01)
H01L 39/10 (2006.01)
G01J 1/44 (2006.01)

(52) U.S. Cl.
CPC ........ *H01L 39/10* (2013.01); *G01J 2001/442* (2013.01); *G01V 2210/1429* (2013.01)

(56) References Cited

U.S. PATENT DOCUMENTS

| | | | |
|---|---|---|---|
| 7,844,188 | B2 | 11/2010 | Takemoto |
| 8,044,355 | B2 | 10/2011 | Gibbons et al. |
| 8,548,567 | B2 | 10/2013 | Maschke et al. |
| 8,674,308 | B2 | 3/2014 | Singer |
| 8,890,049 | B2 | 11/2014 | Yuan et al. |
| 9,002,151 | B2 | 4/2015 | Woodward et al. |
| 9,076,907 | B2 | 7/2015 | Englund et al. |
| 10,934,838 | B2 * | 3/2021 | Stark .................... E21B 47/135 |
| 2004/0141420 | A1 | 7/2004 | Hardage et al. |
| 2005/0011199 | A1 * | 1/2005 | Grisham ................ H01L 35/00 62/3.7 |
| 2013/0128276 | A1 | 5/2013 | Spross et al. |
| 2013/0322873 | A1 | 12/2013 | Stevenson et al. |
| 2014/0087952 | A1 | 3/2014 | Nam et al. |
| 2014/0153926 | A1 | 6/2014 | Mower et al. |
| 2014/0299751 | A1 * | 10/2014 | Tang .................... G01J 1/0425 250/227.11 |
| 2014/0353476 | A1 * | 12/2014 | Bachar .................... G01J 1/42 250/227.24 |
| 2015/0236791 | A1 | 8/2015 | Nordholt et al. |

OTHER PUBLICATIONS

Dyer et al. "Analysis of a Distributed Fiber-Optic Temperature Sensor Using Single-Photon Detectors." *Optics Express*. vol. 20. No. 4. Feb. 13, 2012.

Hadfield. "Single-Photon Detectors for Optical Quantum Information Applications." *Nature Photonics*. vol. 3, pp. 696-705. Dec. 2009.

International Search Report and The Written Opinion of the International Search Authority, or the Declaration, May 26, 2017, PCT/US2016/048930, 16 pages, ISA/KR.

Miki et al. "Large Sensitive-Area NbN Nanowire Superconducting Single-Photon Detectors Fabricated on Single-Crystal MgO Substrates." *Applied Physics Letters*. vol. 92, Issue 6. Jan. 2008.

Tanner et al. "High-Resolution Single-Mode Fiber-Optic Distributed Raman Sensor for Absolute Temperature Measurement Using Superconducting Nanowire Single-Photon Detectors." *Applied Physics Letter*. vol. 99. Dec. 2011.

* cited by examiner

COOLED SINGLE-PHOTON DETECTOR APPARATUS AND METHODS

PRIORITY

The present application is a U.S. National Stage patent application of International Patent Application No. PCT/US2016/048930, filed on Aug. 26, 2016, the benefit of which is claimed and the disclosure of which is incorporated herein by reference in its entirety.

BACKGROUND

Understanding the structure and properties of geological formations can reduce the cost of drilling wells for oil and gas exploration. Measurements made in a borehole (i.e., downhole measurements) are typically performed to attain this understanding, to identify the composition and distribution of material that surrounds the measurement device downhole. Optical detectors are often used to perform these measurements. Optical detectors use fiber optic cables that have greater temperature capability, corrosion resistance and electromagnetic insensitivity as compared to some other types of energy conductors, such as wires or cables. However, optical detectors are still subject to various noise sources that can reduce accuracy and reliability of measurements taken with optical detectors.

DETAILED DESCRIPTION

Noise sources interfere with downhole measurement systems and can cause deterioration in signal-to-noise ratios (SNRs) of measurement signals. Thus, ongoing efforts are directed to reducing noise to improve signal-to-noise ratios in optical detection systems. For example, SNR can be increased by modifying certain parameters (e.g., resolution, fiber depth, and repetition rate). However, modification of these parameters can reduce the accuracy of the optical detection system. To address these concerns and others, systems, apparatuses, and methods described herein provide for cooling optical detectors to ultra-low temperatures (e.g., below 210 degrees Kelvin, below 70 degrees Kelvin or, in some embodiments, below 4 degrees Kelvin). This cooling can reduce or effectively eliminate thermal noise, thereby raising measurement signal SNRs without changing other parameters, in optical sensors for optical sensing.

Figure 1:
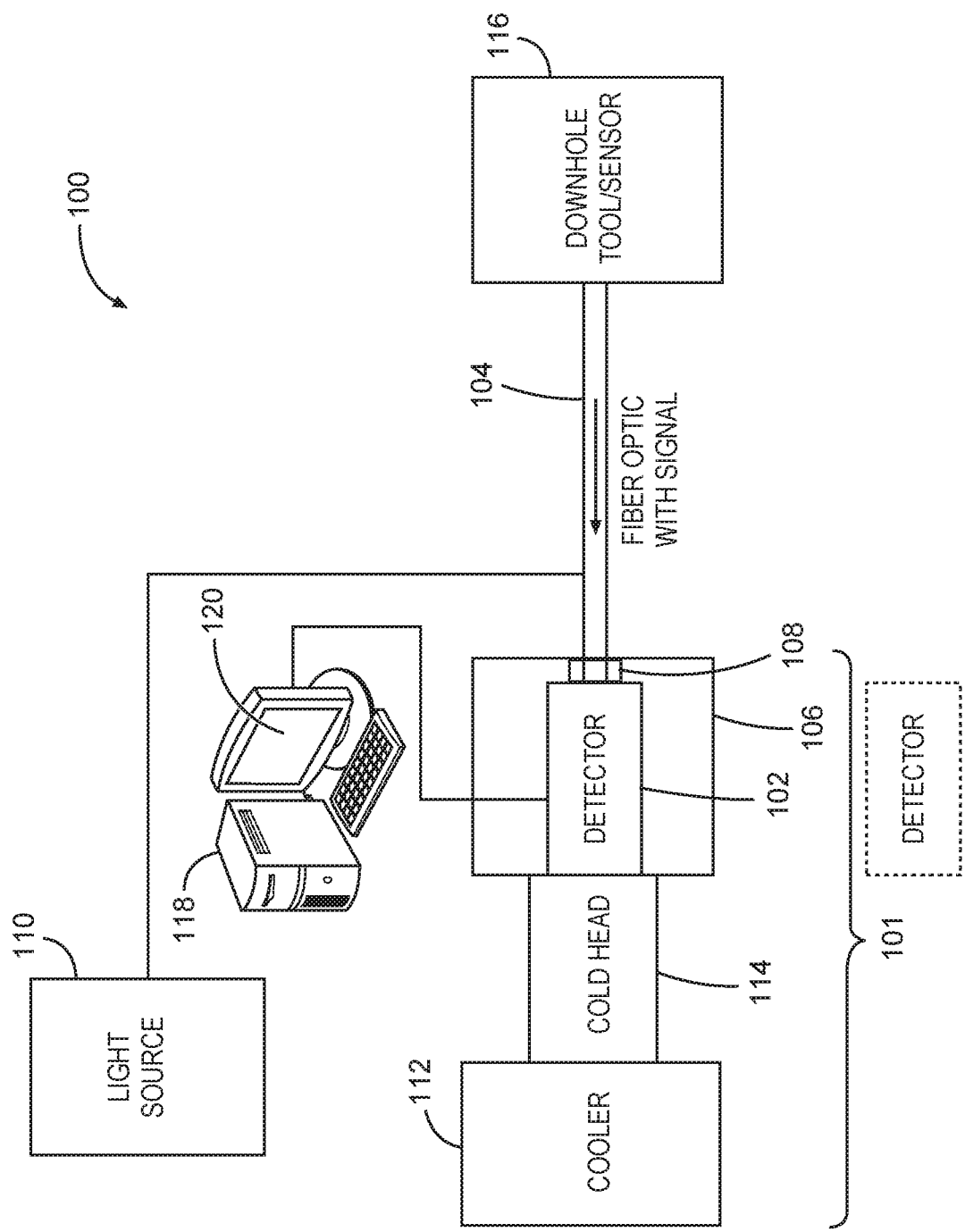
FIG. 1 is a block diagram of an optical detection system including an optical detector and a cooling system including a cold head for cooling the optical detector in accordance with various embodiments.

FIG. 1 is a block diagram of an optical detection system 100. An optical detection apparatus 101 of the optical detection system 100 includes an optical detector 102 for detecting light received through a fiber optic cable 104. In some embodiments, the light includes wavelengths in a visible range of wavelengths. However, embodiments are not limited thereto and the light can include wavelengths in an infrared range of wavelengths and/or in an ultraviolet range of wavelengths.

In some embodiments, the optical detector 102 includes a low-light detector (LLD) or an extremely low-light detector (ELLD). Optical detectors, including LLDs and ELLDs, are available from Photon Spot Inc., of Monrovia, Calif., and from Princeton Instruments of Trenton, N.J. In some embodiments, the optical detector 102 includes a single-photon detector (SPD). In some embodiments, the optical detector 102 includes an avalanche photodiode. An example avalanche photodiode is the PGA-246-25 Single Photon Avalanche Diode available from Princeton Lightwave Inc. of Princeton, N.J. In some embodiments, the optical detector 102 includes carbon nanotubes or other nano structures. However, embodiments are not limited to these example optical detectors and other types of optical detectors can be used. For example, the optical detector 102 can include an integrated optical chip such as a silicon photonic resonator or a focal planar array detector, among other optical detector types.

Figure 2:
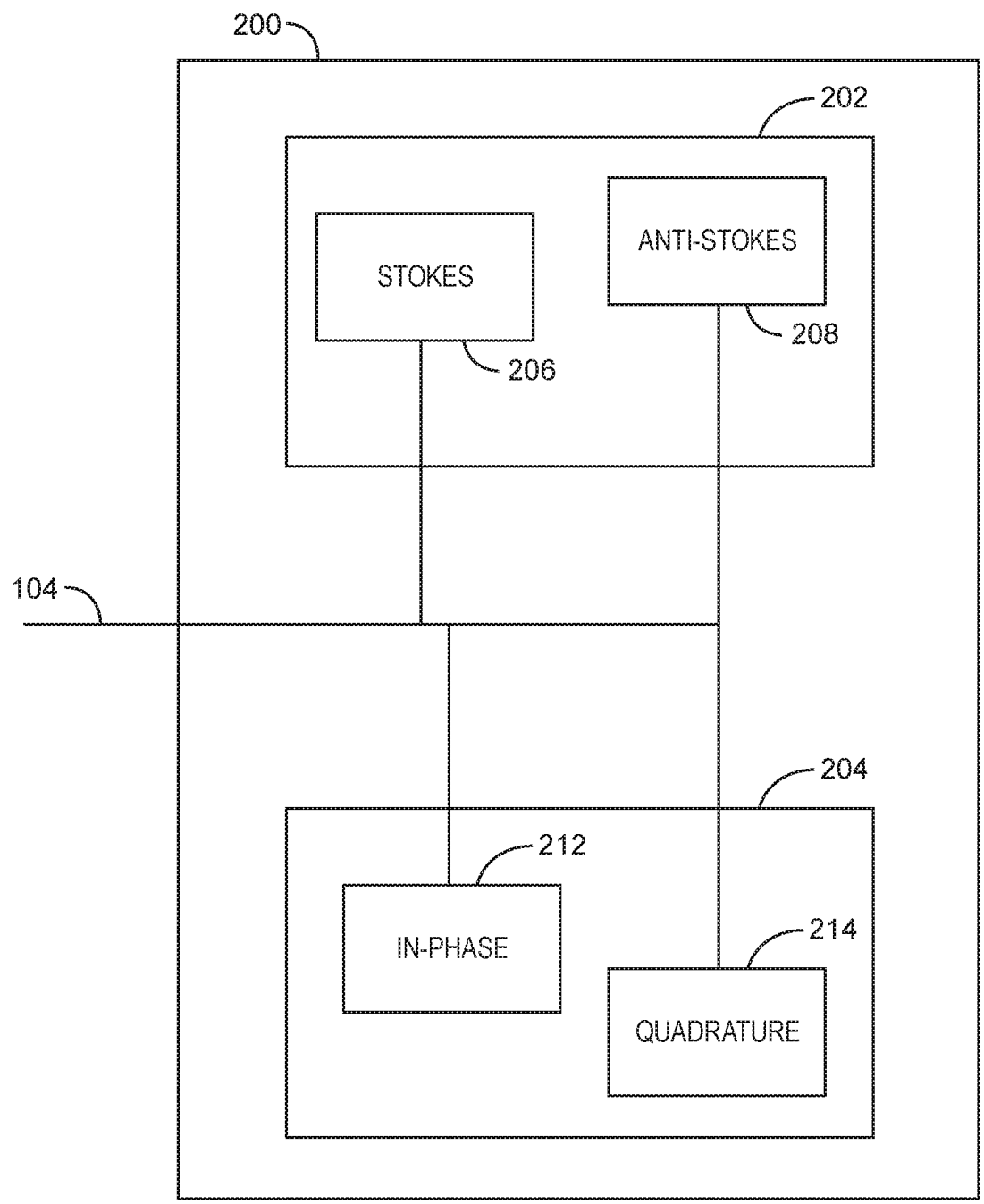
FIG. 2 is a block diagram of a single integrated optical chip including a group of optical detectors dedicated to distributed temperature sensing (DTS) and another group dedicated to distributed acoustic sensing (DAS) in accordance with various embodiments.

In some embodiments, the integrated optical chip can support multiple SPDs with each detector (or group of detectors) dedicated to a specific sensing type. For example, as shown in FIG. 2, a single integrated chip 200 can include a group of optical detectors 202 dedicated to distributed temperature sensing (DTS) and another group 204 dedicated to distributed acoustic sensing (DAS). The DTS group can be further split into sub-groups of optical detectors that can sense scattered light (as opposed to incident light) components, including one group 208 of optical detectors for sensing an anti-Stokes signal and another group 206 of optical detectors for sensing the Stokes signal of scattered light. Likewise, the DAS group can be split into a set 212 of optical detectors that sense one interferometric output (the in-phase) and a set 214 that detects the other output (e.g., the quadrature). Other systems can be provided such as distributed strain sensing (DSS) systems. In some embodiments, the optical detector 102 can include additional optical elements to improve signal to noise ratios. These additional optical elements can include lenses, filters, mirrors, mixers, wavelength demultiplexers, and other elements.

Referring again to FIG. 1, the optical detection apparatus 101 can include a housing 106 for enclosing the optical detector 102 and for providing an optical shield for the optical detector 102. The housing 106 can include an aperture 108 for passage of the fiber optic cable 104. However, embodiments are not limited thereto, and in some embodiments, a coupler can be mounted so that the fiber optic cable 104 terminates at a boundary of the housing 106. The optical detection system 100 includes a light source 110, separate from the optical detector 102 and the housing 106, for providing light through the fiber optic cable 104. In some embodiments, the light source 110 can provide light through one fiber optic cable 104 and light can be received by the optical detector 102 on a separate fiber optic cable 104, although embodiments are not limited to any particular number of fiber optic cables 104 or combinations thereof. In some embodiments, the light source 110 can include additional optical components configured to provide or delivery the appropriate light to the system including filters, mixers, non-linear crystals, timing chips, wavelength multiplexers, etc. In some embodiments, the light source 110 can be downhole and in some embodiments, the light source 110 can be on the surface. In some embodiments, multiple light sources can be provided on the surface, downhole, or a combination thereof.

The optical detection apparatus 101 includes a cooling mechanism 112 having the housing 106 mounted thereto. The cooling mechanism 112 is configured to maintain the temperature of a light-sensitive region of the optical detector 102 within a temperature range below 210 degrees Kelvin. In some embodiments, the cooling mechanism 112 operates using liquid helium (He) or liquid nitrogen ($N_2$). In some embodiments, the cooling mechanism 112 maintains the temperature of the light-sensitive region of the optical detector 102 at a temperature at or below 80 degrees Kelvin. In some embodiments, the cooling mechanism 112 maintains the temperature of the light-sensitive region of the optical detector 102 at a temperature at or below 5 degrees Kelvin (e.g., when sealed helium systems are used). In some embodiments, the cooling mechanism 112 can be of one or more of a variety of configurations, including Dilution-Magnetic, Collins-Helium Liquefier, Joule-Thomson, Stirling-cycle cryocooler, self-regulated Joule-Thomson, Closed-Cycle Split-Type Stirling, Pulse Tube, a two-stage Gifford-McMahon cryogenic cooler or multi-stage Gifford-McMahon cryogenic cooler, or a cooler using magnetocaloric effect, by way of example. Lowering the temperature of the optical detector 102 improves the SNR of the optical detector 102 by decreasing dark current, by increasing sensitivity, and by reducing resistive loss by causing the optical detector 102 to enter a superconducting regime of operation. In some embodiments or configurations non-SPD optical detectors 102 will not enter a superconducting regime, while still having little to no thermal noise.

Figure 3:
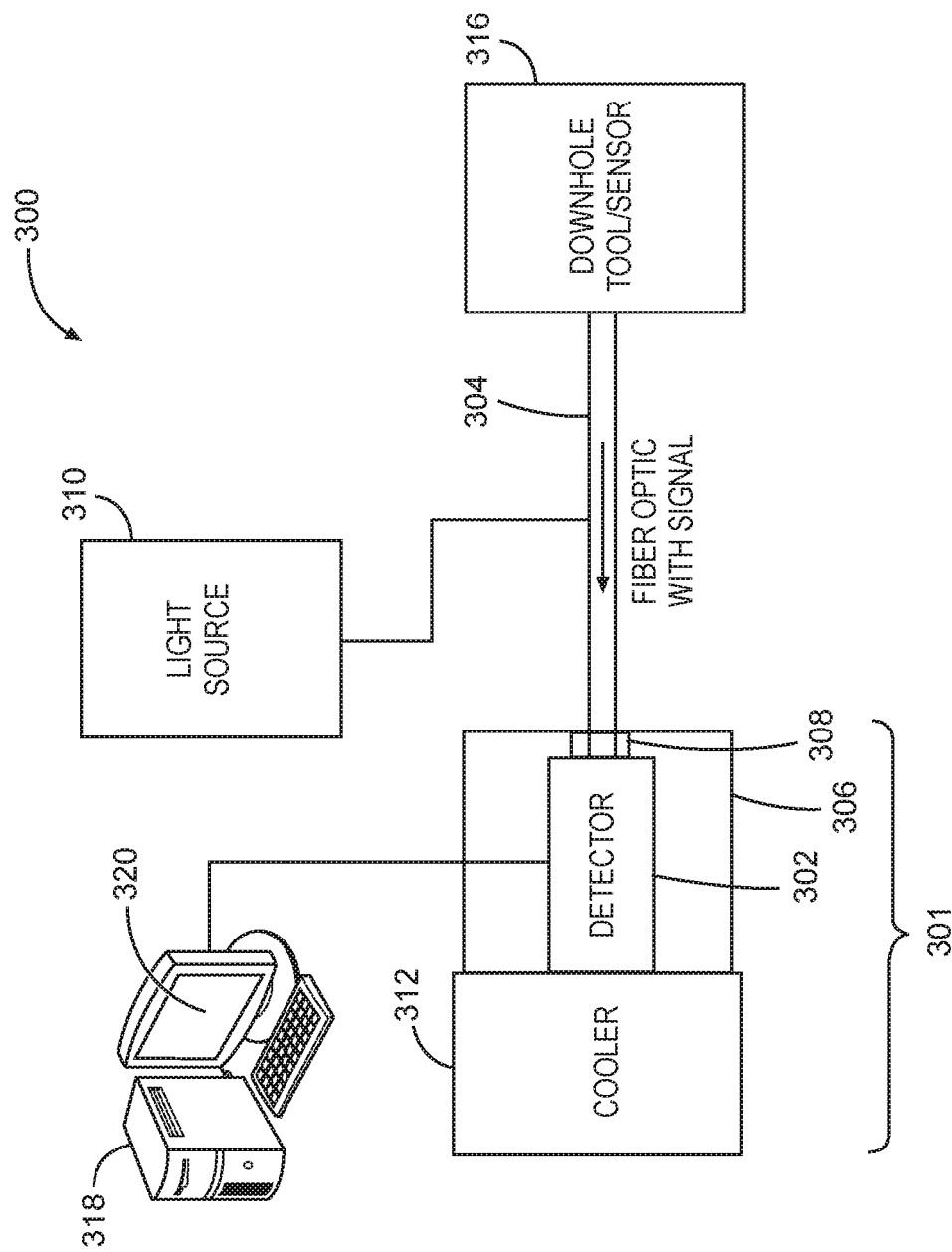
FIG. 3 is a block diagram of an optical detection system including an optical detector and a cooling system, without an intervening cold head, for cooling the optical detector in accordance with various embodiments.

In some embodiments, the optical detection apparatus 101 includes a cold head 114 between the optical detector 102 and the cooling mechanism 112. However, some embodiments do not include a cold head 114. FIG. 3 is a block diagram of an optical detection system 300 including an optical detector 302 and a cooling mechanism 312, without an intervening cold head, for cooling the optical detector 302 in accordance with various embodiments. As with the optical detection system 100, the optical detection system 300 includes a light source 310, and a fiber optic cable 304 coupled between the downhole unit 316 and the optical detector 302. The optical detector 102 can be encased in a housing 306 with or without an aperture 308 for permitting passage of the fiber optic cable 304.

Referring again to FIG. 1, in some embodiments, the housing 106 is mounted to the cooling mechanism 112 such that moisture is prevented from entering the housing. For example, the housing 106 can be mounted such that a vacuum seal is formed with the cooling mechanism 112 or the cold head 114. The housing 106 can have a non-reflective inner surface.

The optical detection system 100 can further include a downhole unit 116 (e.g., a downhole tool or a downhole sensor) configured to provide an optical signal over the fiber optic cable 104. The optical signal can be a pulsed signal originating from distributed sensing, or a continuous signal, among other signals.

The optical detection system 100 can include more than one optical detector 102 (shown within the dashed box in FIG. 1). At least one optical detector 102 can detect light received through the fiber optic cable 104 from more than one downhole unit 116. The optical detection system 100 can include optical detectors 102 of more than one type. For example, some optical detectors 102 in the optical detection system 100 can be SPDs, avalanche photodiodes, integrated optical chips, etc. Some optical detectors 102 can be non-LLD detectors, or non-ELLD detectors (e.g., other than non-SPD detectors). Non-LLD detectors can include p-i-n (or PIN) photodiodes, phototransistors, photovoltaics, photoconductors. Downhole units 116 can include units configured to detect temperature. Other downhole units 116 can be coupled to the same optical detector 102 or to a group of optical detectors 102, or in any other configuration. Downhole units 116 can detect other properties and perform other functions such as acoustic sensing, resistivity measurements, etc. Some optical detectors 102 may not be mounted on any cooling mechanism 112, some optical detectors 102 may be mounted with other optical detectors 102 on a same cooling mechanism 112, or the optical detection system 100 can include more than one cooling mechanism 112 arranged in any configuration with one or more optical detectors mounted thereto.

Figure 4:
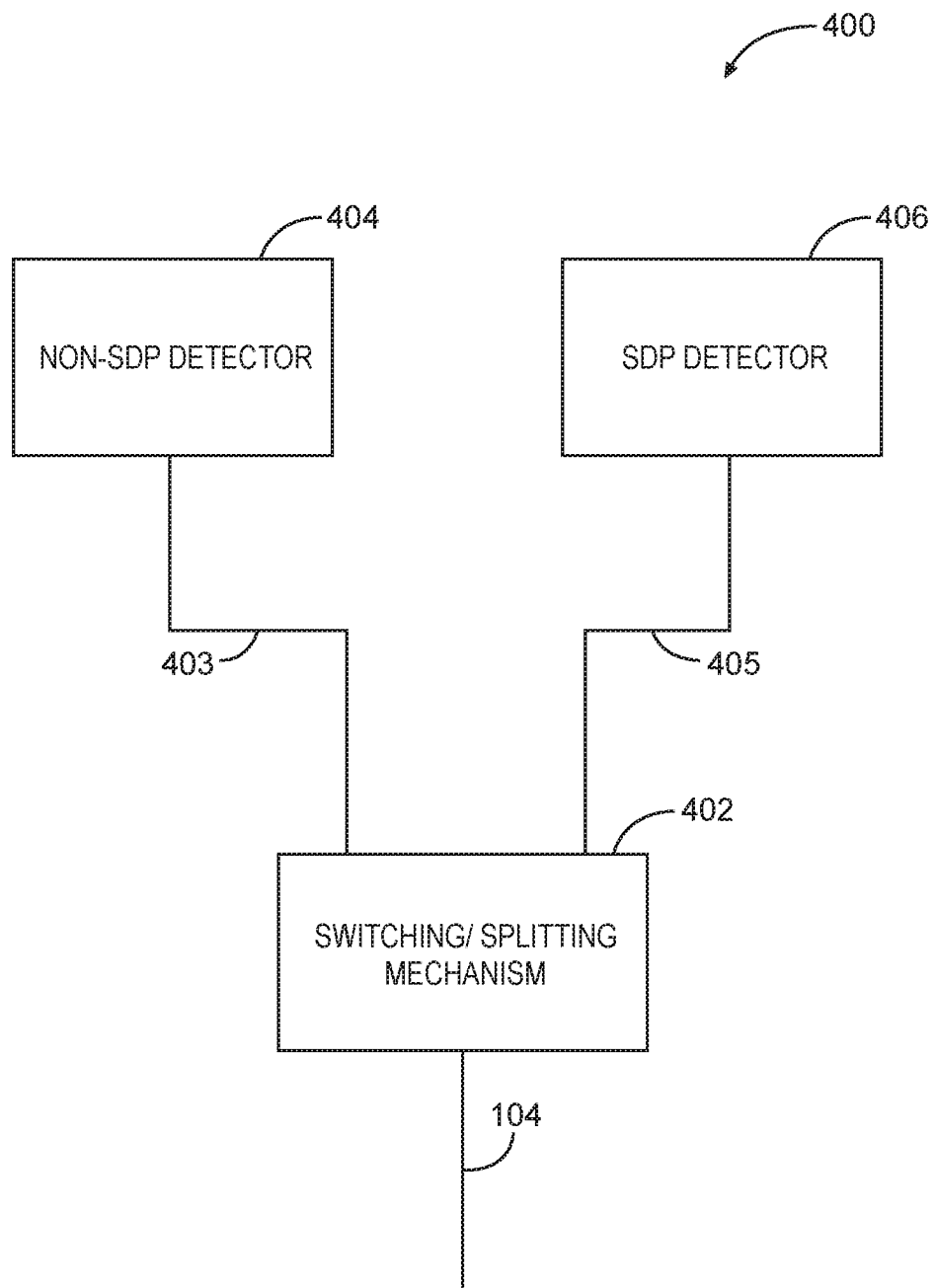
FIG. 4 is a block diagram of an optical detection system including a switching mechanism to direct optical signals to an optical detector in accordance with various embodiments.

As shown in FIG. 4, an optical detection system 400 can further include a switching or splitting mechanism 402 to direct optical signals to an optical detector 404, 406 based on wavelength of the optical signal, power of the optical signal, polarization, or any other parameter or criterion. For example, high-power optical signals 403 can be routed to non-SPD optical detectors 404, and away from SPDs 406 and low-powered optical signals 405 can be routed to SPD optical detectors 406. This routing can be performed to prevent damage to SPD optical detectors 406 while still taking full advantage of LLD and ELLD capabilities of SPD optical detectors 406. As will be appreciated, high-power optical signals 403 can cause saturation in SPDs 406, leading to damage to the SPDs 406 or to inaccurate results. In some examples, saturation of SPDs 406 can occur with optical signal inputs having a power of about 100 microwatts, and damage can occur at about 10 milliwatts. The noise floor that can be detected by the SPD 406 can be at a level slightly below saturation level but is typically at least 20-30 dB. The saturation level and noise floors for non-SPD optical detectors 404 may be different from the saturation level and noise floors for SPDs 406. The saturation levels and noise floors also may or may not overlap, and thus multiple types of detectors may be used that can cover the full power range required for system measurement. For at least these reasons, to measure a larger range of possible optical signals, SPD optical detectors 102 are used in a system with non-SPD optical detectors 102. Splitting mechanisms 402 can direct or reroute optical signals based on power level or other criteria, to take advantage of the different power ranges measurable by SPD optical detectors 102 versus non-SPD optical detectors 102.

In addition to or instead of a splitting mechanism 402, the optical detection system 100 can include a coupling mechanism or other mechanism to split the light with optical couplers (with or without feedback). These mechanisms can be multi-stage (e.g., the light can be split in one stage, then split again in a second stage), and can split light based on power, wavelength, or phase. Processor or computation-based systems can also be used in some embodiments to dynamically direct or reroute light signals among any available optical path as power increases, or based on any other criteria.

Figure 6:
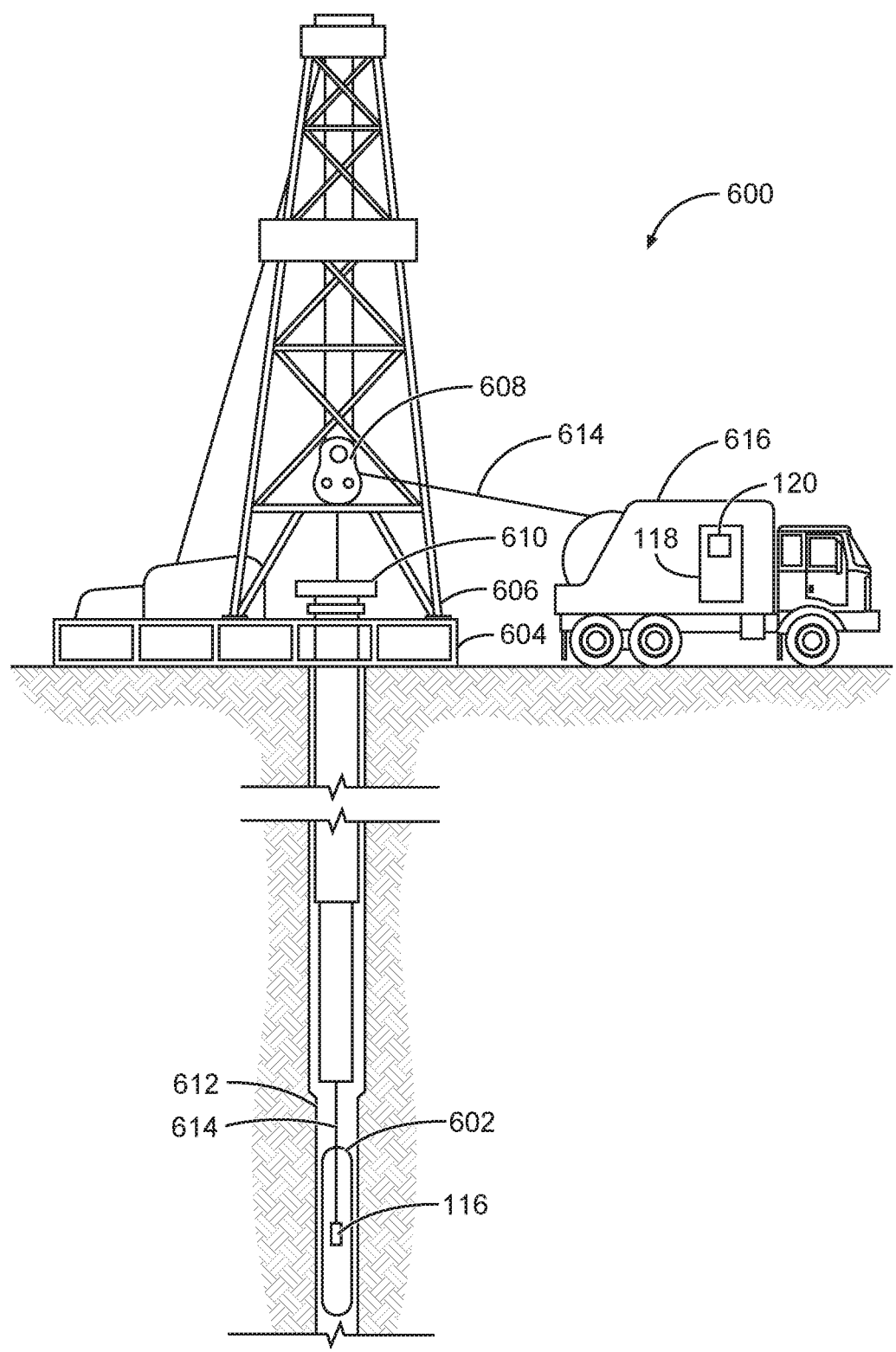
FIG. 6 is a diagram of a wireline system embodiment.
Figure 7:
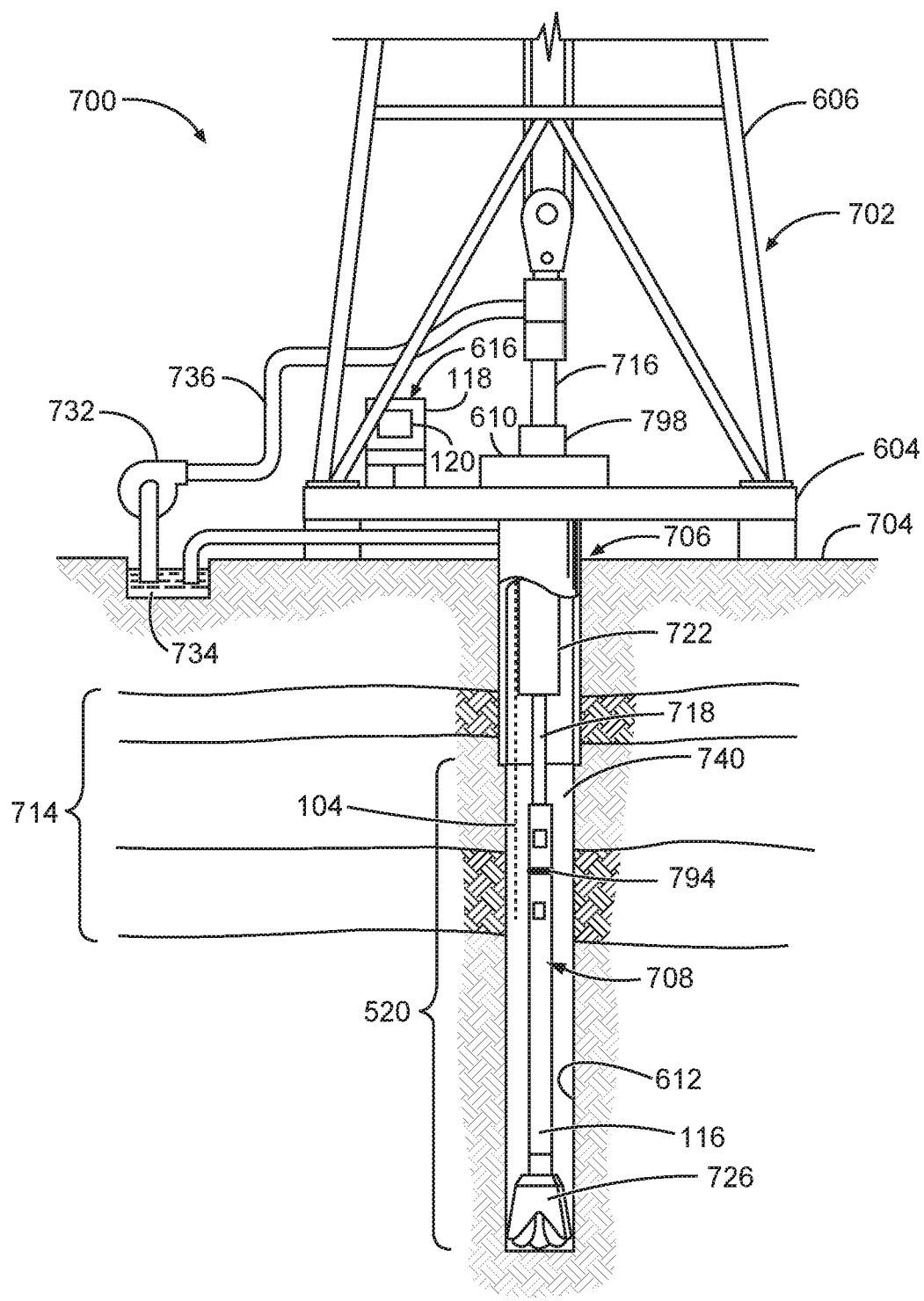
FIG. 7 is a diagram of a drilling rig system embodiment.

Referring again to FIG. 1, the optical detection system 100 can further include a measuring device 118 (which may be part of a computer workstation) coupled to the optical detector 102 to obtain measurement data, with a display 120 to display a graphical representation of the measurement data. In some embodiments, some portions of the optical detection system 100 can be positioned at a surface of the Earth, while some portions to the optical detection system 100 can be placed downhole. When more than one optical detector 102 is used, for example, some of the optical detectors 102 can be placed downhole, and some can be placed at the surface. In some embodiments, one or more cooling mechanisms 112 can be placed downhole proximate one or more optical detectors 102 although power and geometry considerations should be taken into account with such configurations to provide power for cooling in an appropriately sized borehole. In some embodiments, the measuring device 118 and display 120 will be situated at the surface of the Earth, for example as shown in FIGS. 6 and 7 described later herein.

Figure 5:
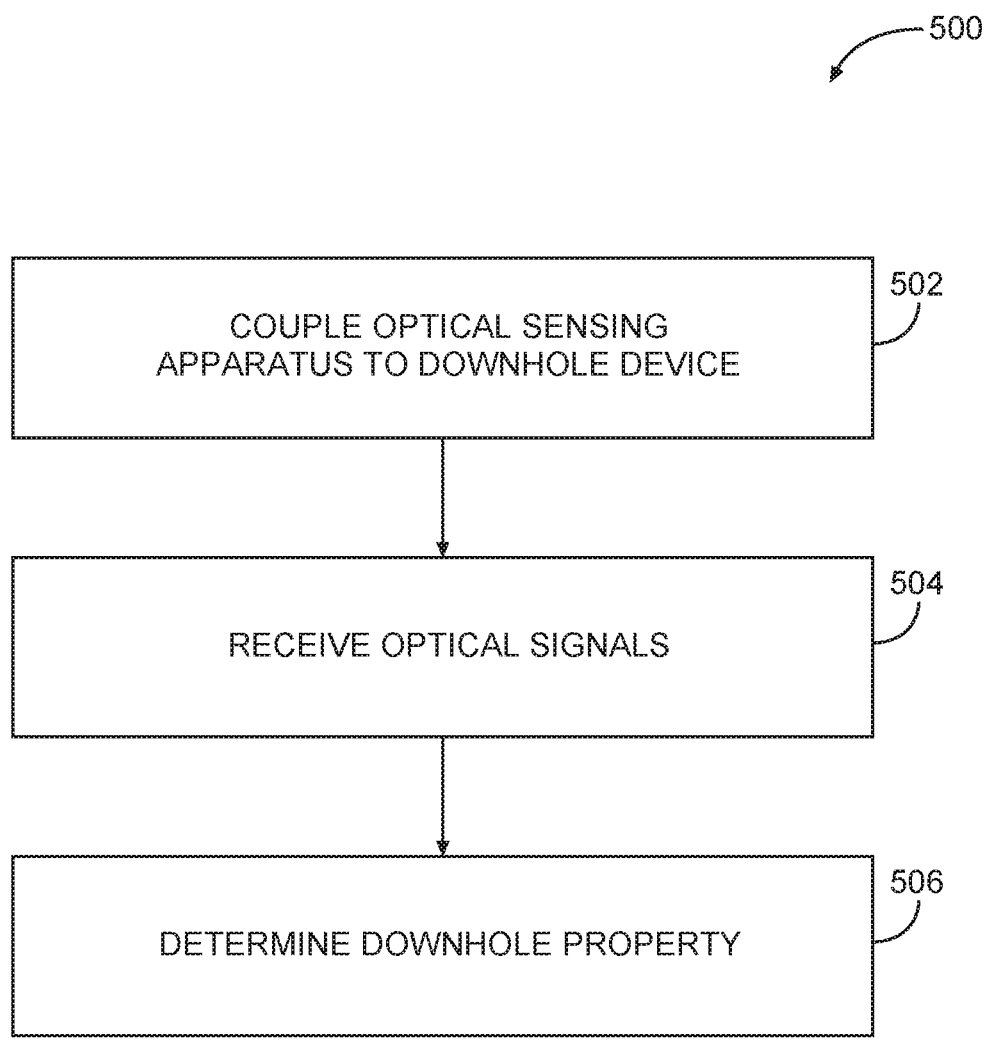
FIG. 5 is a flow chart of an example method of optical sensing in accordance with some embodiments.

FIG. 5 is a flow chart of an example method 500 of optical sensing in accordance with some embodiments. The example method 500 can be performed by the optical detection system 100 (FIG. 1) or by components thereof. The example method 500 begins with operation 502 with coupling an optical sensing apparatus to a downhole unit 116 (e.g., a downhole sensing device) through a fiber optic cable 104. The optical sensing apparatus can include at least one optical detector 102 within a housing 106. However, embodiments are not limited to one optical detector 102. The optical detector 102 can be cooled to a temperature below 210 degrees Kelvin by a cooling mechanism 112. In some embodiments, the optical detector 102 can be cooled to a temperature below 5 degrees Kelvin.

The example method 500 continues with operation 504 with the optical detector 102 receiving optical signals from the downhole sensing device over the fiber optic cable 104. In some embodiments, the downhole sensing device includes an intrinsic fiber optic sensor. In other embodiments, the downhole sensing device comprises at least one fiber Bragg grating or some other reflector. In at least these embodiments, the example method 500 can further include providing an optical signal to the intrinsic fiber optic sensor and receiving a reflected or backscattered optical signal, responsive to providing the optical signal, that represents at least one downhole property. In embodiments, the backscattered signal can include Stokes and anti-Stokes components, or Raleigh components.

In embodiments, many optical signals can be multiplexed onto the fiber optic cable 104. In at least these embodiments, the example method 500 can further include de-multiplexing the optical signals at a switching mechanism, and providing the de-multiplexed signals on at least two separate paths to at least two separate optical detectors 102.

The example method 500 continues with operation 506 with the optical detection system 100 detecting at least one downhole property based on the optical signals. For example, the optical signal can be used to detect different properties of downhole structures, to provide optical analysis of fluid and material composition in a borehole or annulus, to perform geosteering, to determine values for porosity or composition of the borehole wall, etc.

FIG. 6 is a diagram of a wireline system 600 embodiment. The wireline system 600 can comprise portions of a wireline logging tool body 602 as part of a wireline logging operation. Thus, FIG. 6 shows a well during wireline logging operations. In this case, a drilling platform 604 is equipped with a derrick 606 that supports a hoist 608.

Drilling oil and gas wells is commonly carried out using a string of drill pipes connected together so as to form a drilling string that is lowered through a rotary table 610 into a wellbore or borehole 612. Here it is assumed that the drilling string has been temporarily removed from the borehole 612 to allow a wireline logging tool body 602, such as a probe or sonde, to be lowered by wireline or logging cable 614 into the borehole 612. Typically, the wireline logging tool body 602 is lowered to the bottom of the region of interest and subsequently pulled upward at a substantially constant speed.

During the upward trip, at a series of depths instruments (e.g., downhole units 116 described above with reference to FIG. 1) included in the wireline logging tool body 602 can be used to perform measurements on the subsurface geological formations adjacent the borehole 612 (and the wireline logging tool body 602). The measurement data can be communicated to a surface logging facility 616 for storage, processing, and analysis. The logging facility 616 can be provided with electronic equipment for various types of signal processing, which can be implemented by any one or more of the components of the optical detection system 100 (FIG. 1). Similar formation evaluation data can be gathered and analyzed during drilling operations (e.g., during LWD operations, and by extension, sampling while drilling).

The wireline logging tool body 602 is suspended in the wellbore by a wireline cable 614 that connects the tool to a surface control unit (e.g., comprising a workstation 118, which can also include a display 120). This wireline cable 614 can include (or perform functionalities of) the fiber optic cable 104 (FIG. 1). The tool can be deployed in the borehole 612 on coiled tubing, jointed drill pipe, hard wired drill pipe, or any other suitable deployment technique.

In addition to wireline embodiments, example embodiments can also be implemented in drilling rig systems. FIG. 7 illustrates a drilling rig system 700 embodiment. The system 700 can include a downhole unit 116 as part of a downhole drilling operation.

Referring to FIG. 7, it can be seen how a system 700 can also form a portion of a drilling rig 702 located at the surface 704 of a well 706. The drilling rig 702 can provide support for a drill string 708. The drill string 708 can operate to penetrate the rotary table 610 for drilling the borehole 612 through the subsurface formations 714. The drill string 708 can include a Kelly 716, drill pipe 718, and a bottom hole assembly 720, perhaps located at the lower portion of the drill pipe 718.

The bottom hole assembly 720 can include drill collars 722, a downhole tool 724, and a drill bit 726. The drill bit 726 can operate to create the borehole 612 by penetrating the surface 704 and the subsurface formations 615. The downhole tool 724 can comprise any of a number of different types of tools including MWD tools, LWD tools, and others. In some examples, fiber optic cable 104 will be spliced, rerouted, coupled, guided, or otherwise modified to maintain connections at each drill collar 722 and at each position along the drill string 708. In some embodiments, a fiber optic connector can be provided at each drill collar 722 or other joint or position downhole. In some embodiments, the fiber optic cable 104 can be placed inside a steel casing as shown in FIG. 7, outside a casing, inside or outside of a production tube, inside or outside of coiled tubing, on a wireline cable, or in any other placement, configuration, or combination thereof. In some embodiments, downhole units 116 can be placed in a repeater configuration or in an amplifier configuration to improve signal strength at the surface. In yet other embodiments, fiber can be deployed continuously through a drill string using a dart, a torpedo, a reel, a feedthrough, or some other deployment device.

During drilling operations, the drill string 708 (perhaps including the Kelly 716, the drill pipe 718, and the bottom hole assembly 720) can be rotated by the rotary table 610. Although not shown, in addition to, or alternatively, the bottom hole assembly 720 can also be rotated by a motor (e.g., a mud motor) that is located downhole. The drill collars 722 can be used to add weight to the drill bit 726. The drill collars 722 can also operate to stiffen the bottom hole assembly 720, allowing the bottom hole assembly 720 to transfer the added weight to the drill bit 726, and in turn, to assist the drill bit 726 in penetrating the surface 704 and subsurface formations 714.

Thus, it can be seen that in some embodiments, the systems 600, 700 can include a drill collar 722, a downhole tool 724, and/or a wireline logging tool body 602 to house one or more downhole units, similar to or identical to the downhole units 116 providing information over the fiber optic cable 104 and illustrated in FIGS. 1 and 2.

Thus, for the purposes of this document, the term "housing" when used to address tools below the surface (e.g., downhole), can include any one or more of a drill collar 722, a downhole tool 724, or a wireline logging tool body 602 (all having an outer wall, to enclose or attach to magnetometers, sensors, fluid sampling devices, pressure measurement devices, transmitters, receivers, acquisition and processing logic, and data acquisition systems). The tool 724 can comprise a downhole tool, such as an LWD tool or MWD tool. The wireline logging tool body 602 can comprise a wireline logging tool, including a probe or sonde, for example, coupled to a logging cable 614. Many embodiments can thus be realized.

Thus, a system 600, 700 can comprise a downhole tool body, such as a wireline logging tool body 602 or a downhole tool 724 (e.g., an LWD or MWD tool body), and fiber optic cable 104 to provide signaling to the optical detection system 100 or to components thereof (e.g., an optical detector 102) as described above.

The physical structure of such instructions can be operated on by one or more processors. Executing instructions determined by these physical structures can cause the optical detection system 100 or components thereof to perform operations according to methods described herein. The instructions can include instructions to cause associated data or other data to be stored in a memory.

The wireline logging tool body 602 (FIG. 6) can include or otherwise be utilized in conjunction with any number of measurement tools such as resistivity tools, seismic tools, acoustic tools, temperature sensors, porosity sensors and others. In one embodiment, the wireline logging tool body 602 is equipped with transmission equipment to communicate ultimately to a surface processing unit of a surface logging facility 616 (FIG. 6). Such transmission equipment can take any desired form, and different transmission media and methods can be used. Examples of connections include wired, fiber optic, wireless connections and memory based systems.

Additional Embodiments

As mentioned earlier herein with respect to FIG. 1, optical detectors 102 in the optical detection system 100 (FIG. 1) can be SPDs. These SPDs can detect very low levels of light found in many photonics-based applications. Low light levels may, in some limit the ability to conduct downhole sensing operations. For example, some systems have losses of up to 110 dB, which limits the range, data rate, or the resolution of operation of optical detection systems. As further described earlier herein, the SNR in some systems can be reduced due to the presence of noise sources, including thermal noise and other noise. Some embodiments provide optical detection systems that use SPDs to enhance or increase SNRs by removing noise sources and reducing signal loss. Some embodiments also provide more robust data detection for enhanced sensing.

SPDs, such as superconducting nanowire SPDs (SNSPDs), operate by detecting a quantum state disturbance by an incoming photon incident on the corresponding optical detector 102. By combining the use of SPD-type optical detector 102 at the surface with downhole units 116, very low-energy signals (e.g., at the energy of a single photon) can be detected. In addition, SNSPD-type optical detectors 102 can provide efficient operation at a wide range of wavelengths (e.g., from ultra-violet to mid-infrared wavelength regions), low dark counts (due to the removal of thermal noise from the optical detection system 100), short recovery periods (e.g., recovery periods on the order of 1-10 nanoseconds), and low timing jitter (e.g., timing jitter on the order of 100-500 picoseconds). SPD-type optical detectors 102 can be integrated into closed-cycle refrigerator-based detector systems, allowing for advanced photon counting in oil and gas exploration operations that rely on portability and durability in fielded detection devices and systems.

SPDs can operate over wavelengths of 100-200 nm centered around a center frequency that depends on the fabrication of the SPD. By changing parameters of the fabrication (e.g., the timing or duration of etching or the thickness of a nanowire layer, substrate, or other thickness), the center frequency can be constructed to span wavelengths between ultraviolet wavelengths to mid/far infrared (~200 nm to ~10 micron). Once fabricated though, the SNSPD device spans up to ~200 nm. Accordingly, to detect wavelengths covering a range of, e.g., 200 nm to 10,000 nm, an optical detection apparatus should include 50 SPDs with center frequencies separated by 200 nm.

Figure 8:
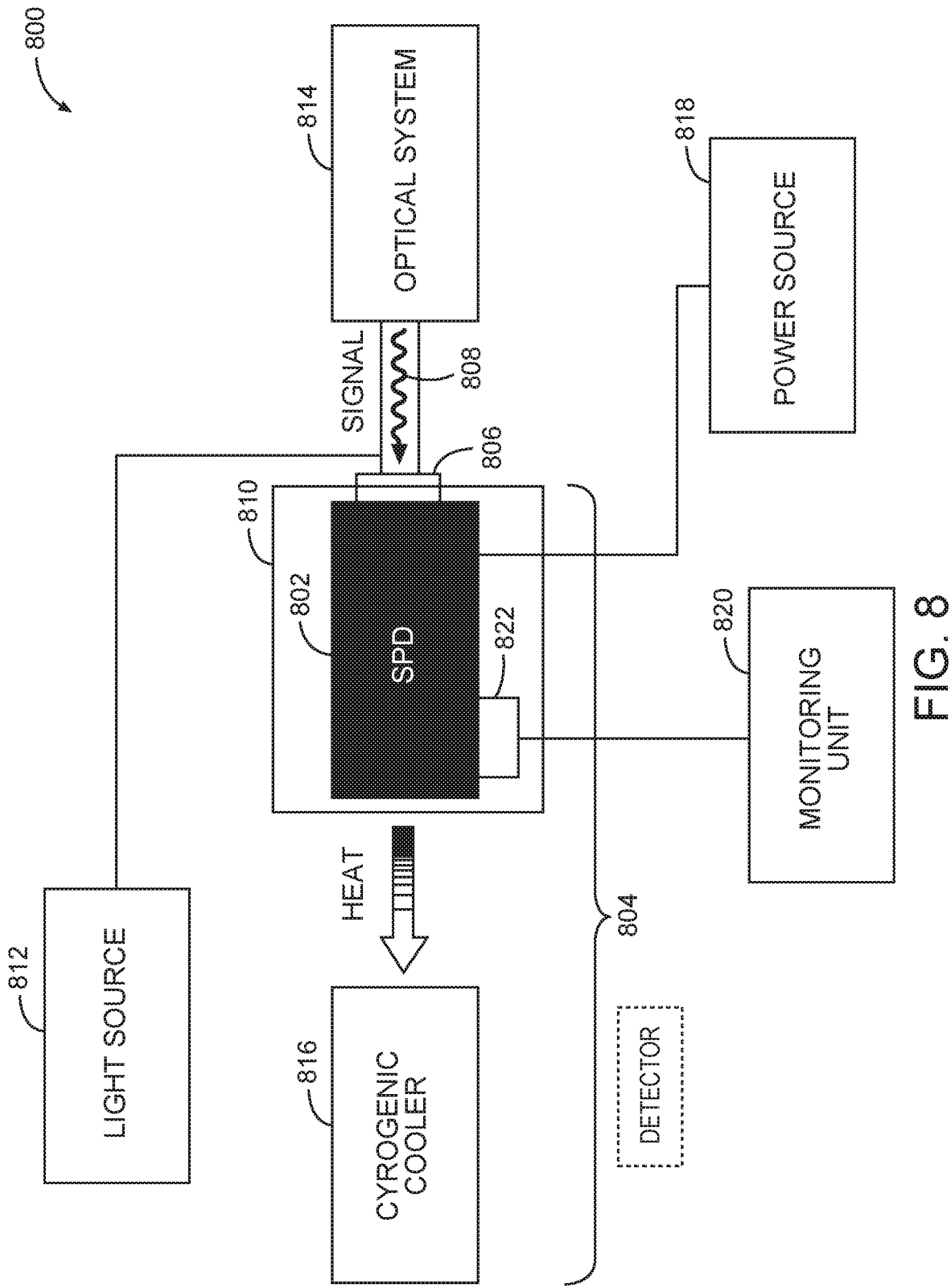
FIG. 8 a block diagram of an optical detection system including a superconducting nanowire single-photon detector (SNSPD) in accordance with various embodiments.

FIG. 8 a block diagram of an optical detection system 800 including an SPD in accordance with various embodiments. An optical detection apparatus 804 includes an optical detector (e.g., an SNSPD) 802 for detecting light received at an input section 806 of fiber optic cable 808. The optical detection apparatus 804 can further include a housing 810 for enclosing the optical detector 802 and optically shielding the optical detector 802. In some embodiments, the input section 806 of fiber optic cable can pass through a housing aperture to permit passage of the fiber optic cable 808. However, embodiments are not limited thereto, and in some embodiments, a coupler can be mounted so that the fiber optic cable 808 terminates at a boundary of the housing 810.

Similarly to the optical detection system 100 (FIG. 1), the optical detection system 800 includes a light source 812, separate from the optical detector 802 and the housing 810, for providing light through the fiber optic cable 808 to a downhole sensing unit 814.

The optical detection system 800 further includes a cryogenic cooler 816 to remove heat to maintain the temperature of a light-sensitive region of the optical detector 802 within a superconducting temperature range of the optical detector 802. As described above regarding the cooling mechanism 112 (FIG. 1), in some embodiments, the cryogenic cooler 816 operates using one of liquid helium (He) and liquid nitrogen ($N_2$), to reach temperatures ranging down to about 77 K or about 2.5 K. The cryogenic cooler 816 can operate in a closed-loop system with a few hundred watts (e.g. 100-200 watts) of power, and has low servicing and replenishment specifications, which enables portable and low-risk use in oil and gas operations. As described above, the cryogenic cooler 816 can be of one or more of a variety of configurations, including Dilution-Magnetic, Collins-Helium Liquefier, Joule-Thomson, Stirling-cycle cryocooler, self-regulated Joule-Thomson, Closed-Cycle Split-Type Stirling, Pulse Tube, a two-stage Gifford-McMahon cryogenic cooler or multi-stage Gifford-McMahon cryogenic cooler, or a cooler using magnetocaloric effect, by way of example.

Similarly to the optical detection system 100 (FIG. 1), the optical detection system 800 can further include multiple optical detectors, which can be SPD optical detectors, SNSPD optical detectors, or other types of non-SPD optical detectors. An SPD optical detector 802 can detect light within a first dynamic range while non-SPD optical detectors can detect levels of light having a dynamic range distinct, but not necessarily exclusive, of the first dynamic range.

Figure 9A:
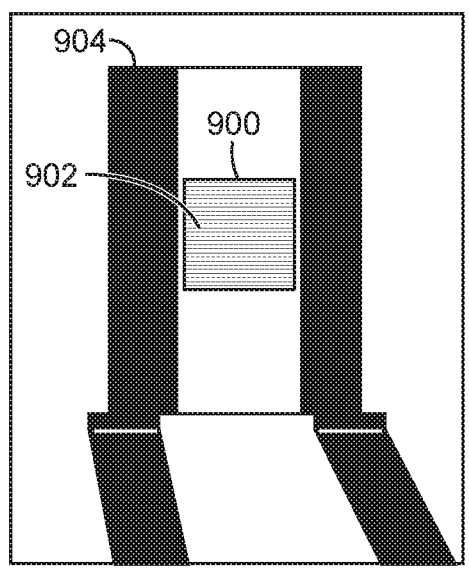
FIG. 9A illustrates an SNSPD using meandering nanowires in accordance with various embodiments.
Figure 9B:
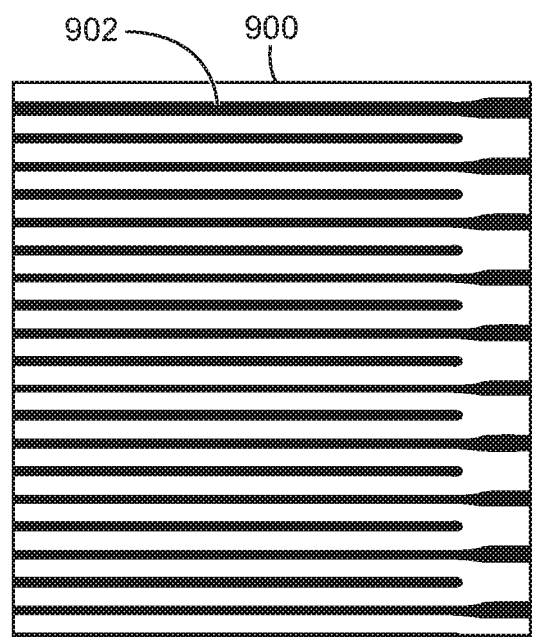
FIG. 9B illustrates an enlarged view of a superconductive portion of the SNSPD of FIG. 9A.

An SNSPD for use in various embodiments can be configured to include a superconductive meandering nanowire structure. FIG. 9A illustrates an SNSPD 900 using meandering nanowires 902 in accordance with various embodiments. FIG. 9B illustrates an enlarged view of the SNSPD 900 of FIG. 9A. The SNSPD 900 of FIGS. 9A and 9B can include niobium nitride nanowires grown on magnesium oxide or sapphire substrates, although embodiments are not limited to any particular substrate material or nanowire material. For example, the nanowires 902 can also include tungsten silicide, niobium silicide, and tantalum nitride. The nanowires 902 meander between bonding pads 904 in a compact meander geometry to create a square or circular pixel with high detection efficiency. Embodiments are not limited to a meandering nanowire 902. For example, the nanowires 902 can be configured in a superconductive interleaved nanowire structure, and/or nanowires 902 can be parallel to each other.

The dimensions (e.g., diameter, length, etc.) of the nanowires 902 are chosen such that a uniform optical cavity, optimized for the specific wavelength of the produced light, is provided along the length of nanowire. The nanowires 902 can be fabricated such that the diameter of the nanowire 902 is sufficiently wide to capture the desired light. For example, the diameter of the nanowire 902 should be larger than $\lambda/2n_w$, wherein $\lambda$ is the wavelength of the desired light and $n_w$ is the refractive index of the nanowire. For example, nanowires 902 used in various embodiments can have diameters of about 90-100 nanometers or less, or to a few hundred nanometers.

Some embodiments provide a reflective layer or a cavity on the substrate that extends under the nanowire 902. The reflective layer can reflect light that is guided by the nanowire 902. The reflective layer can be provided in the form of a multilayered structure comprising repeated layers of silicates for example, or as a metal film to provide further system efficiencies due to light or photon reflection that allows the nanowire a second chance to detect a given photon or photons. Some embodiments can include many layers (e.g., three to five layers, or more) of photonic crystals (e.g., $Ta_2O_5$ or $SiO_2$), Referring again to FIG. 8, a cooling mechanism (e.g., cryogenic cooler 816 (or a cooling mechanism 112 (FIG. 1) or a cooling mechanism 312 (FIG. 3) can be used to cool a nanowire of the optical detector 802 below the nanowire superconducting critical temperature. A power source 818 provides the optical detector 802 with current. A photon incident on a nanowire of the optical detector 802 breaks Cooper pairs and creates a localized non-superconducting region, or hotspot, with finite electrical resistance on the nanowire. A monitoring unit 820 coupled to an output 822 of the optical detector 802 has an impedance lower than an impedance of a non-superconducting region of the optical detector 802 so that current is shunted to the monitoring unit 820, resulting in a measurable voltage at the monitoring unit 820. When the current is shunted from the optical detector 802, the non-superconducting region of the optical detector 802 can then be re-cooled below a superconducting critical temperature. The monitoring unit 820 detects that a signal has been received at the optical detector 802 and the monitoring unit 820 can provide the signal, or notification of the signal, for further processing. The monitoring unit 820 can be included as a component of the system 600, 700 (FIG. 6 and FIG. 7, respectively) for display or any other use in determining properties of a downhole formation. The monitoring unit 820 can also include, or be coupled to other components that include, a timing unit and a counting unit to determine when photons hit the optical detector 802, and how many photons hit the optical detector 802. A timing unit 821 can provide a time stamp. The monitoring unit 820 can also provide a counter to count the protons in reflected measurement signals or other signals.

Figure 10:
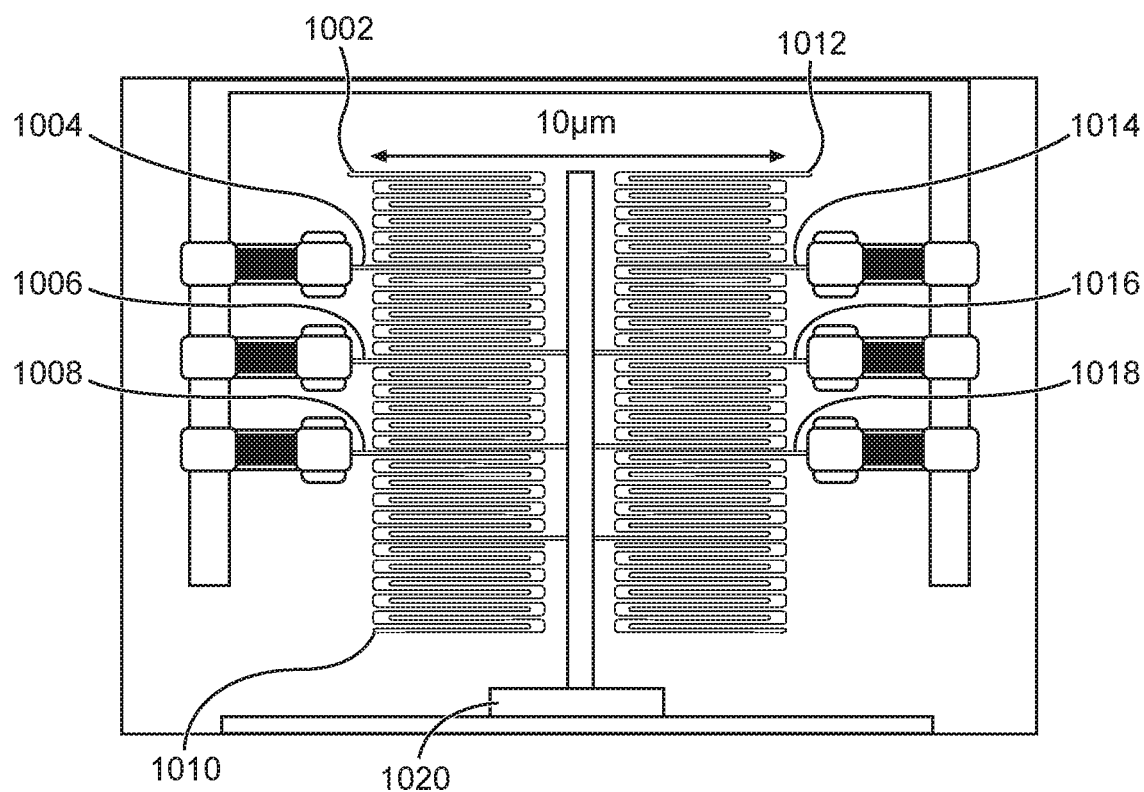
FIG. 10 illustrates an SNSPD having parallel pixels in accordance with various embodiments.

In some embodiments, an SNSPD-type optical detector 802 includes multiple superconducting nanowire structures. FIG. 10 illustrates an SNSPD having multiple superconducting nanowire structures 1002, 1004, 1006, 1008, 1010, 1014, 1016, 1018 arranged in parallel in accordance with various embodiments. In some embodiments, the multiple superconducting nanowire structures 1002, 1004, 1006, 1008, 1010, 1014, 1016, 1018 share a common ground 1020, or groups of multiple superconducting nanowire structures share a common ground. In some embodiments, the common ground is on a second surface of the magnesium oxide substrate (or other type of substrate) opposing the first surface of the magnesium oxide substrate on which the superconducting nanowire structures 1002, 1004, 1006, 1008, 1010, 1014, 1016, 1018 are grown. In some embodiments, at least two of the multiple superconducting nanowire structures have separate power sources. In some embodiments, the multiple superconducting nanowire structures 1002, 1004, 1006, 1008, 1010, 1014, 1016, 1018 share are each configured to measure one signal (e.g., a Stokes signal or an anti-Stokes signal, etc.). In another array of pixels, on the same chip but in a different location on the chip in some embodiments, superconducting nanowire structures will measure the Stokes or anti-Stokes signal that is the counterpart of the Stokes or anti-Stokes signal measured by the multiple superconducting nanowire structures 1002, 1004, 1006, 1008, 1010, 1014, 1016, 1018.

Referring again to FIG. 8, by adjusting or adapting the width and pitch of the nanowire/s during fabrication of the optical detector 802, the optical detector 802 can be made more efficient. In a 100% efficient SPD-type optical detector 802, a signal is produced every time a single photon enters optical detector 802. However, photons can arrive at the optical detector 802 at different polarizations (among other variations). SNSPDs (in contrast to other types of optical detectors) are sensitive to the polarization of light due to the usage of nanowires in their construction, because nanowires are relatively straight along their length, and thus nanowires detect fields that align with the nanowire along its length.

Figure 11:
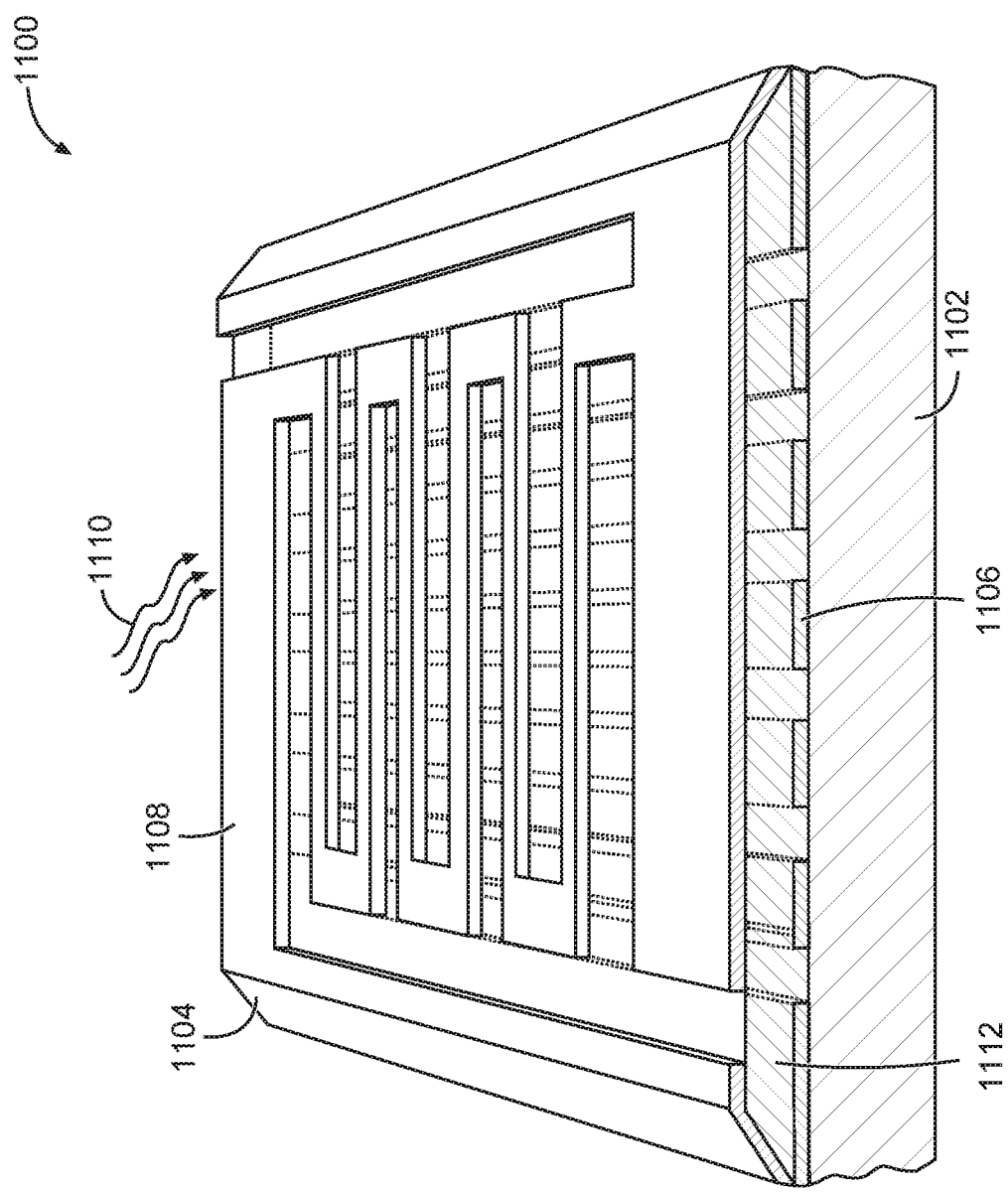
FIG. 11 illustrates a multilayer SNSPD structure in accordance with various embodiments.

Multilayer SNSPD constructions can overcome these and other challenges to provide improved efficiency. For example, as illustrated in FIG. 11, two or more layers 1102 and 1104 can be vertical stacked and connected in parallel (with a common power source, common ground, etc.) to form a multilayer SNSPD 1100. Each layer 1102, 1104 can have nanowires 1106, 1108 meandering in different patterns, or oriented at orthogonal angles with respect to one another, so that reduced absorptance of light 1110 incident on the SNSPD 1100 at one layer 1102, 1104 will be offset or adjusted for by absorptance variations at the other layer 1102, 1104. By using multiple layers of nanowires 1106, 1108 with different pitches and patterns, polarization sensitivity can be reduced and the efficiency of the optical detector 802 (FIG. 8) can be enhanced or improved. Additionally, or in the alternative, some embodiments provide multiple layers, each layer detecting a different wavelength or range of wavelengths, so that the optical detector 802 can detect a larger range of wavelengths.

As with other embodiments discussed earlier herein with respect to FIGS. 1-5, the optical detector 802 can be used in a variety of optical systems, including various types of sensor systems. In sensor-based applications, use of SPD-type optical detectors can improve the resolution or deployable distance of distributed acoustic sensing (DAS) systems, distributed temperature sensing (DTS) systems, distributed strain systems (DSS), and distributed chemical sensing systems, etc. Use of SPD-type optical detectors can also allow for high transmission loss interconnects, enabling offshore monitoring. Optical detection systems that use SPD-type optical detectors can be used in systems including many low transmission loss interconnects, for example drill strings that have an interconnect, and some transmission loss, at every joint. Furthermore, optical detection systems that make use of SPD-type optical detectors can detect visible light, and therefore such systems can find extended usage in spectroscopy applications, in rubidium-based gyroscopes, and in rubidium-based magnetometers in on-shore and offshore drilling and oil exploration applications. Optical detection systems that make use of SPD-type optical detectors can detect very weak signals (e.g., light signals of one photon can be detected), and therefore these optical detection systems can perform operations to operational depths of 35,000 feet or more. Such systems can also operate with minimal or no downhole electronics, leading to cost savings for operators.

Figure 12:
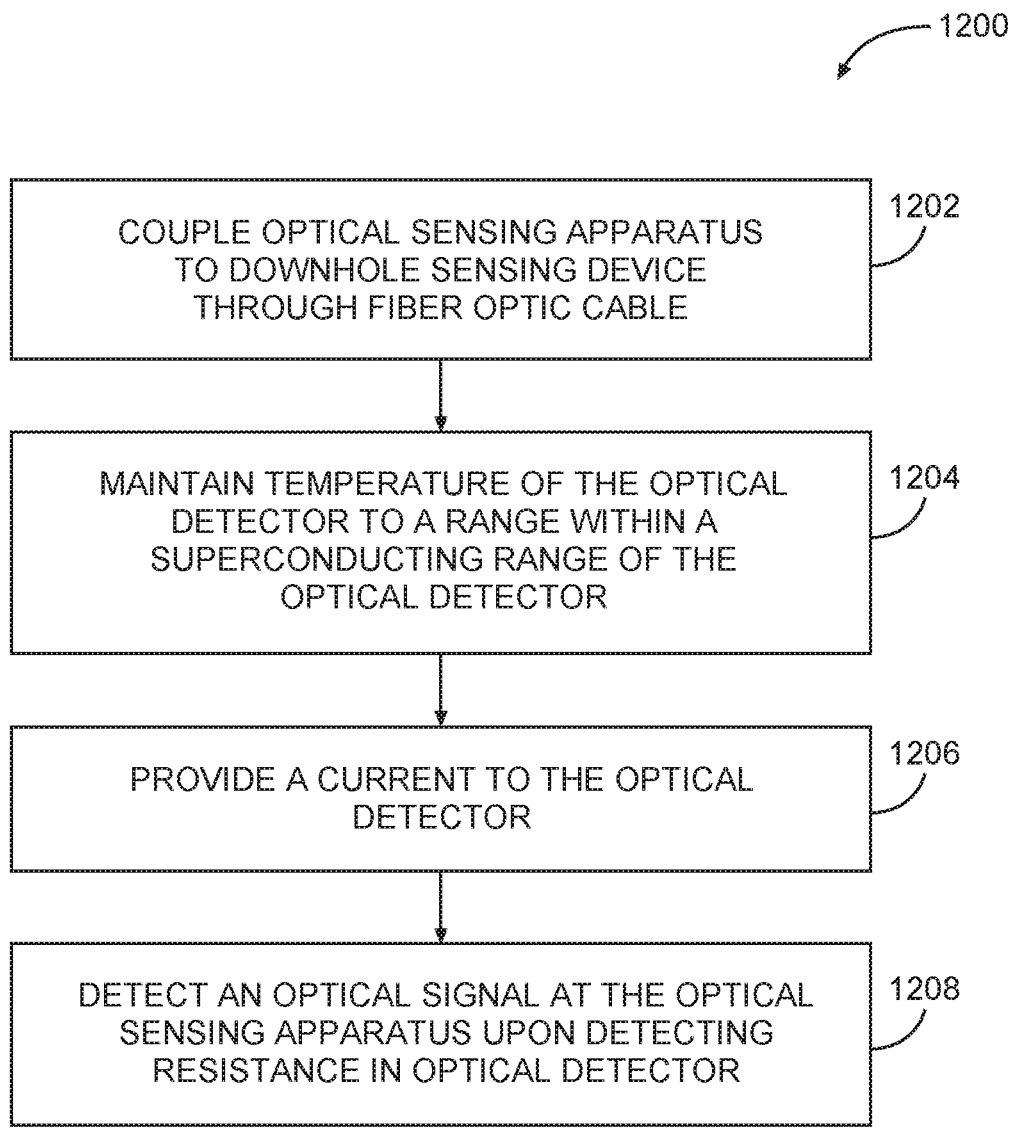
FIG. 12 is a flow chart of an example method of optical sensing with an SNSPD optical detector in accordance with various embodiments.

FIG. 12 is a flow chart of an example method 1200 of optical sensing using an SNSPD optical detector in accordance with some embodiments. The example method 1200 can be performed by the optical detection system 800 (FIG. 8) or by components thereof. The example method 1200 begins at operation 1202 by coupling an optical detection apparatus 804 to a downhole sensing unit 814 through a fiber optic cable 808. The optical detection apparatus 804 includes at least one SNSPD-type optical detector 802.

The example method 1200 continues with operation 1204 with the cryogenic cooler 816 maintaining the temperature of the SNSPD-type optical detector 802 within a superconducting range of the SNSPD-type optical detector 802.

The example method 1200 continues with operation 1206 with the power source 818 providing current to the SNSPD-type optical detector 802.

The example method 1200 continues with operation 1208 with detecting an optical signal at the optical detection apparatus 804 upon the monitoring unit 820 measuring a voltage proportional to the superconducting critical current of the SNSPD-type optical detector 802. The voltage will be generated when photons received at the SNSPD-type optical detector 802 raise the temperature of the SNSPD-type optical detector 802 above the superconducting range of the SNSPD-type optical detector 802 to create an electrical impedance in the SNSPD-type optical detector 802. The optical signal can be time-correlated to determine how many photons were detected in a certain time period. Other operations can include counting the number of photons received during a time period to provide a photon count and detecting a downhole property based on the photon count.

In some embodiments in which the optical detection apparatus 804 further includes at least one optical detector 802 that is not an SNSPD or SPD, the example method 1200 further includes directing optical signals having a power level greater than a threshold power level to the at least one optical detector that is not an SPD or SNSPD. In embodiments in which the downhole sensing unit 814 includes an intrinsic fiber optic sensor, the example method 1200 can include providing an optical signal to the intrinsic fiber optic sensor; and receiving a reflected optical signal, responsive to providing the optical signal, that represents at least one downhole property.

In various embodiments, a non-transitory machine-readable storage device can comprise instructions stored thereon, which, when performed by a machine, cause the machine to perform operations, the operations comprising one or more features similar to or identical to features of methods and techniques described herein. A machine-readable storage device, herein, is a physical device that stores data represented by physical structure within the device. Examples of machine-readable storage devices can include, but are not limited to, memory in the form of read only memory (ROM), random access memory (RAM), a magnetic disk storage device, an optical storage device, a flash memory, and other electronic, magnetic, or optical memory devices, including combinations thereof. These can be provided in integrated chips that include optical detectors 102, or in other surface computer systems for taking measurements or analyzing measurements as part of the optical detection system 100, 300 or 800 (FIGS. 1, 3 and 8).

Any of the above components, for example components of the optical detection system 100, 300, 800, can all be characterized as "modules" herein. Such modules can include hardware circuitry, and/or a processor and/or memory circuits, software program modules and objects, and/or firmware, and combinations thereof, as desired by the architect of the optical detection system 100 as appropriate for particular implementations of various embodiments. For example, in some embodiments, such modules can be included in an apparatus and/or system operation simulation package, such as a software electrical signal simulation package, a power usage and distribution simulation package, a power/heat dissipation simulation package, and/or a combination of software and hardware used to simulate the operation of various potential embodiments.

It should also be understood that the apparatus and systems of various embodiments can be used in applications other than for logging operations, and thus, various embodiments are not to be so limited. The illustrations of optical detection systems 100, 300 and 800 are intended to provide a general understanding of the structure of various embodiments, and they are not intended to serve as a complete description of all the elements and features of apparatus and systems that might make use of the structures described herein.

Applications that can include the novel apparatus and systems of various embodiments include electronic circuitry used in high-speed computers, communication and signal processing circuitry, modems, processor modules, embedded processors, data switches, and application-specific modules. Some embodiments include a number of methods.

It should be noted that the methods described herein do not have to be executed in the order described, or in any particular order. Moreover, various activities described with respect to the methods identified herein can be executed in iterative, serial, or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that can be employed to create one or more software programs designed to implement and perform the methods disclosed herein. For example, the programs can be structured in an object-orientated format using an object-oriented language such as Java or C#. In another example, the programs can be structured in a procedure-orientated format using a procedural language, such as assembly or C. The software components can communicate using any of a number of mechanisms well known to those skilled in the art, such as application program interfaces or interprocess communication techniques, including remote procedure calls. The teachings of various embodiments are not limited to any particular programming language or environment. Thus, other embodiments can be realized.

In summary, using the apparatus, systems, and methods disclosed herein can provide more accurate measurements by optical detection apparatuses through removal or reduction of noise sources including thermal noise sources. These advantages can significantly enhance the value of the services provided by an operation/exploration company, while at the same time controlling time-related costs.

The accompanying drawings that form a part hereof, show by way of illustration, and not of limitation, specific embodiments in which the subject matter can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter can be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose can be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

Various examples include:

Example 1 is an apparatus (e.g., a device, optical detection apparatus or other apparatus for detection or sensing) comprising: an optical detector including a superconducting nanowire single-photon detector (SNSPD) for detecting light received at an input section of fiber optic cable; a housing for enclosing the optical detector and to optically shield the optical detector, the housing including an aperture for passage of the fiber optic cable; a light source, separate from the optical detector and the housing, for providing light through the fiber optic cable to a downhole unit; and a cryogenic cooler configured to maintain the temperature of a light-sensitive region of the SNSPD within a superconducting temperature range of the SNSPD.

In Example 2, the subject matter of Example 1 can optionally include wherein the cryogenic cooler operates using one of liquid helium (He) or liquid nitrogen ($N_2$.).

In Example 3, the subject matter of Example 1 can optionally include wherein the SNSPD has a superconductive meandering nanowire structure.

In Example 4, the subject matter of Example 1 can optionally include wherein the SNSPD has a superconductive interleaved nanowire structure.

In Example 5, the subject matter of Example 1 can optionally include wherein nanowires of the SNSPD are grown on a first surface of a magnesium oxide substrate.

In Example 6, the subject matter of Example 5 can optionally include wherein the optical detector includes a plurality of superconducting nanowire structures.

In Example 7, the subject matter of Example 6 can optionally include wherein the plurality of superconducting nanowire structures share a common ground.

In Example 8, the subject matter of Example 7 can optionally include wherein the common ground is on a second surface of the magnesium oxide substrate opposing the first surface of the magnesium oxide substrate.

In Example 9, the subject matter of Example 1 can optionally include wherein the SNSPD comprises at least two substrates including a first substrate and a second substrate, and wherein a first superconducting nanowire layer on the first substrate is arranged at an orthogonal angle to a second superconducting nanowire layer on the second substrate.

Example 10 is an system (e.g., a detection system, e.g., an optical detection system, etc.) comprising: a downhole unit configured to provide an optical signal over a fiber optic cable; a light source configured to provide light through the fiber optic cable to the downhole unit; an optical detector including a superconducting nanowire single-photon detector (SNSPD) for detecting light received through an input section of the fiber optic cable; a housing for enclosing the optical detector and to optically shield the optical detector, the housing including an aperture for passage of the fiber optic cable; a light source, separate from the optical detector and the housing, for providing light through the fiber optic cable; a cryogenic cooler configured to maintain the temperature of a light-sensitive region of the SNSPD within a superconducting temperature range of the SNSPD; a power source to provide the SNSPD with a current; and a monitoring unit coupled to an output of the SNSPD, the monitoring unit having an impedance lower than an impedance of a non-superconducting region of the SNSPD, the monitoring unit configured to provide measurement data of the SNSPD.

In Example 11, the subject matter of Example 10 can optionally include wherein the optical detector includes a plurality of superconducting nanowire structures.

In Example 12, the subject matter of Example 11 can optionally include wherein at least two of the plurality of superconducting nanowire structures have separate power sources.

In Example 13, the subject matter of Example 10 can optionally include a distributed acoustic sensing unit (DAS).

In Example 14, the subject matter of Example 10 can optionally include a distributed temperature sensing unit (DTS).

In Example 15, the subject matter of Example 10 can optionally include a distributed strain sensing unit (DSS).

In Example 16, the subject matter of Example 10 can optionally include wherein the SNSPD detects light within a first dynamic range and wherein the optical detection system further includes at least a second optical detector for detecting levels of light having a dynamic range distinct from and not exclusive of the first dynamic range.

In Example 17, the subject matter of Example 10 can optionally include a switching mechanism to direct an optical signal to one of a plurality of optical detectors based on at least one of a power level, wavelength, and polarization of the optical signal.

In Example 18, the subject matter of Example 17 can optionally include a non-SPD optical detector for detecting high-power light signals, and wherein the switching mechanism is further configured to direct optical signals having a power level above a threshold power level to the non-SPD optical detector.

In Example 19, the subject matter of Example 10 can optionally include a display to display a graphical representation of the measurement data.

Example 20 is a method of optical sensing including: coupling an optical detection apparatus to a downhole sensing unit through a fiber optic cable, the optical detection apparatus including at least one superconducting nanowire single-photon detector (SNSPD); maintaining the temperature of the SNSPD to a range within a superconducting range of the SNSPD; providing current to the SNSPD; and detecting an optical signal at the optical detection apparatus upon measuring a voltage proportional to the superconducting critical current of the SNSPD, the voltage being generated when photons received at the SNSPD raise the temperature of the SNSPD above the superconducting range of the SNSPD to create an electrical impedance in the SNSPD.

In Example 21, the subject matter of Example 20 can optionally include counting the number of photons received during a time period to provide a photon count; and detecting a downhole property based on the photon count.

In Example 22, the subject matter of Example 20 can optionally include wherein the optical detection apparatus further includes at least one optical detector that is not a single-photon detector (SPD), and wherein the method further includes directing optical signals having a power level greater than a threshold power level to the at least one optical detector that is not an SPD.

In Example 23, the subject matter of Example 20 can optionally include wherein the downhole sensing unit includes an intrinsic fiber optic sensor and wherein the method further comprises: providing an optical signal to the intrinsic fiber optic sensor; and receiving a reflected or backscattered optical signal that represents at least one downhole property.

Although specific embodiments have been illustrated and described herein, it will be appreciated by those of ordinary skill in the art that any arrangement that is calculated to achieve the same purpose can be substituted for the specific embodiments shown. Various embodiments use permutations or combinations of embodiments described herein. It is to be understood that the above description is intended to be illustrative, and not restrictive, and that the phraseology or terminology employed herein is for the purpose of description.

Combinations of the above embodiments and other embodiments will be apparent to those of ordinary skill in the art upon studying the above description.

What is claimed is:

1. An optical detection apparatus comprising:
   an optical detector including a superconducting nanowire single-photon detector (SNSPD) for detecting light received at an input section of fiber optic cable;
   a housing for enclosing the optical detector and to optically shield the optical detector, the housing including an aperture for passage of the fiber optic cable;
   a light source, separate from the optical detector and the housing, for providing light through the fiber optic cable to a downhole unit;
   a cryogenic cooler configured to maintain the temperature of a light-sensitive region of the SNSPD within a superconducting temperature range of the SNSPD; and
   a monitoring unit coupled to an output of the SNSPD, the monitoring unit having an impedance lower than an impedance of a non-superconducting region of the SNSPD, the monitoring unit configured to provide measurement data of the SNSPD.

2. The optical detection apparatus of claim 1, wherein the cryogenic cooler operates using one of liquid helium (He) or liquid nitrogen ($N_2$.).

3. The optical detection apparatus of claim 1, wherein:
   the SNSPD has a superconductive meandering nanowire structure; or
   the SNSPD has a superconductive interleaved nanowire structure.

4. The optical detection apparatus of claim 1, wherein nanowires of the SNSPD are grown on a first surface of a magnesium oxide substrate.

5. The optical detection apparatus of claim 4, wherein the optical detector includes a plurality of superconducting nanowire structures.

6. The optical detection apparatus of claim 5, wherein the plurality of superconducting nanowire structures share a common ground.

7. The optical detection apparatus of claim 6, wherein the common ground is on a second surface of the magnesium oxide substrate opposing the first surface of the magnesium oxide substrate.

8. The optical detection apparatus of claim 1, wherein the SNSPD comprises at least two substrates including a first substrate and a second substrate, and wherein a first superconducting nanowire layer on the first substrate is arranged at an orthogonal angle to a second superconducting nanowire layer on the second substrate.

9. An optical detection system comprising:
   a downhole unit configured to provide an optical signal over a fiber optic cable;

a light source configured to provide light through the fiber optic cable to the downhole unit;

an optical detector including a superconducting nanowire single-photon detector (SNSPD) for detecting light received through an input section of the fiber optic cable;

a housing for enclosing the optical detector and to optically shield the optical detector, the housing including an aperture for passage of the fiber optic cable;

a light source, separate from the optical detector and the housing, for providing light through the fiber optic cable;

a cryogenic cooler configured to maintain the temperature of a light-sensitive region of the SNSPD within a superconducting temperature range of the SNSPD;

a power source to provide the SNSPD with a current; and a monitoring unit coupled to an output of the SNSPD, the monitoring unit having an impedance lower than an impedance of a non-superconducting region of the SNSPD, the monitoring unit configured to provide measurement data of the SNSPD.

10. The optical detection system of claim 9, wherein the optical detector includes a plurality of superconducting nanowire structures.

11. The optical detection system of claim 10, wherein at least two of the plurality of superconducting nanowire structures have separate power sources.

12. The optical detection system of claim 9, further comprising:
a distributed acoustic sensing unit (DAS);
a distributed temperature sensing unit (DTS); or
a distributed strain sensing unit (DSS).

13. The optical detection system of claim 9, wherein the SNSPD detects light within a first dynamic range and wherein the optical detection system further includes at least a second optical detector for detecting levels of light having a dynamic range distinct from and not exclusive of the first dynamic range.

14. The optical detection system of claim 9, further including a switching mechanism to direct an optical signal to one of a plurality of optical detectors based on at least one of a power level, wavelength, and polarization of the optical signal.

15. The optical detection system of claim 14, further comprising a non-SPD optical detector for detecting high-power light signals, and wherein the switching mechanism is further configured to direct optical signals having a power level above a threshold power level to the non-SPD optical detector.

16. The optical detection system of claim 9, further comprising:
a display to display a graphical representation of the measurement data.

17. A method of optical sensing including:
coupling an optical detection apparatus to a downhole sensing unit through a fiber optic cable, the optical detection apparatus including at least one superconducting nanowire single-photon detector (SNSPD);
maintaining the temperature of the SNSPD to a range within a superconducting range of the SNSPD;
providing current to the SNSPD; and
detecting an optical signal at the optical detection apparatus upon measuring a voltage proportional to the superconducting critical current of the SNSPD, the voltage being generated when photons received at the SNSPD raise the temperature of the SNSPD above the superconducting range of the SNSPD to create an electrical impedance in the SNSPD.

18. The method of claim 17, further comprising:
counting the number of photons received during a time period to provide a photon count; and
detecting a downhole property based on the photon count.

19. The method of claim 17, wherein the optical detection apparatus further includes at least one optical detector that is not a single-photon detector (SPD), and wherein the method further includes directing optical signals having a power level greater than a threshold power level to the at least one optical detector that is not an SPD.

20. The method of claim 17, wherein the downhole sensing unit includes an intrinsic fiber optic sensor and wherein the method further comprises:
providing an optical signal to the intrinsic fiber optic sensor; and
receiving a reflected or backscattered optical signal that represents at least one downhole property.

* * * * *